(12) United States Patent
Kim et al.

(10) Patent No.: US 7,771,081 B2
(45) Date of Patent: Aug. 10, 2010

(54) LED PACKAGE AND BACKLIGHT UNIT USING THE SAME

(75) Inventors: Dae Yeon Kim, Kyungki-do (KR); Young Sam Park, Seoul (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 0 days.

(21) Appl. No.: 12/497,009

(22) Filed: Jul. 2, 2009

(65) Prior Publication Data

US 2009/0268457 A1     Oct. 29, 2009

Related U.S. Application Data

(62) Division of application No. 11/594,756, filed on Nov. 9, 2006, now Pat. No. 7,581,853.

(30) Foreign Application Priority Data

Dec. 21, 2005     (KR) ................ 10-2005-0126774

(51) Int. Cl.
*F21V 8/00*     (2006.01)
(52) U.S. Cl. ............... 362/235; 362/555; 362/249.02; 362/311.02; 362/97.3
(58) Field of Classification Search .......... 362/307, 362/231, 235, 249.02, 311.02, 97.3, 335, 362/203, 545, 612, 555
See application file for complete search history.

(56) References Cited

U.S. PATENT DOCUMENTS

| 5,040,868 A | 8/1991 | Waitl et al. |
| 5,126,620 A * | 6/1992 | Haraga et al. ............ 313/111 |
| 5,836,676 A | 11/1998 | Ando et al. |
| 6,443,597 B1 | 9/2002 | Natori |
| 6,598,998 B2 | 7/2003 | West et al. |
| 2007/0091443 A1 | 4/2007 | Lim et al. |

OTHER PUBLICATIONS

Power Light Source Luxeon® K2 Technical Datasheet DS51, 2008, Philips Lumileds Lighting Company.

* cited by examiner

*Primary Examiner*—Sharon E Payne
(74) *Attorney, Agent, or Firm*—McDermott Will & Emery LLP

(57) ABSTRACT

The invention relates to an LED package having a large beam angle of light emitted from an LED, simplifying a shape of a lens and an assembly process, and to a backlight unit using the same. The LED package includes a housing with a seating recess formed therein and at least one LED seated in the seating recess. The LED package also includes a lens having a predetermined sag on an upper side thereof, covering an upper part of the LED. The LED package and the backlight unit using the same can emit light uniformly without bright spots formed in an output screen, uses a simpler shaped lens with an increased beam angle, and minimizes a color mixing region to achieve miniaturization.

19 Claims, 8 Drawing Sheets

LED PACKAGE AND BACKLIGHT UNIT USING THE SAME

CLAIM OF PRIORITY

This application is a Divisional of U.S. patent application Ser. No. 11/594,756, filed on Nov. 9, 2006, now U.S. Pat. No. 7,581,853 claims the benefit of Korean Patent Application No. 2005-126774 filed on Dec. 21, 2005, in the Korean Intellectual Property Office, the entire contents of each of which are hereby incorporated by reference.

BACKGROUND OF THE INVENTION

1. Field of the Invention

The present invention relates to a light emitting diode (LED) package and a backlight using the same, and more particularly, to an LED package which includes a lens whose upper side for refracting the light from an LED has a convex surface with a large angle of beam, by which the shape of the lens and an assembly process can be simplified, and a backlight unit using the same.

2. Description of the Related Art

Recently, there exists a need for a large-sized Liquid Crystal Display (LCD) capable of outputting a large-sized image. In the case of using a Cold Cathode Fluorescent Lamp (CCFL) for a light source of the LCD, there are spatial and environmental limitations with use of mercury. Thus, a Light Emitting Diode (LED) with its high efficiency and advantage for miniaturization is widely used for the light source of the LCD.

With the current trend of compact products, the LCDs are also miniaturized these days. Recently, there have been suggested an LED package, which is configured to have a larger beam angle of an LED, thereby achieving miniaturization, and a backlight unit using the same.

Now, a conventional LED package and a backlight unit using the same will be explained in detail with reference to the accompanying drawings.

FIG. 1 is a sectional view illustrating the conventional LED package, and FIG. 2 is a sectional view illustrating the backlight unit using the conventional LED package.

The conventional LED package shown in FIG. 1 includes a housing 10, a lens 20 seated in the housing 10 and an LED provided inside the lens 20.

The lens 20 has a funnel-shaped recess on an upper surface thereof, with its outer surface narrowing downward, thereby laterally emitting the light from the LED 30. Here, the outer surface of the lens 20 may be shaped not only as illustrated in FIG. 1 but also in complex and various forms as suggested in U.S. Pat. No. 6,598,998. In addition, such LED packages 1 emitting three different colors are mounted in the backlight unit to suitably mix the colors, thereby outputting a desired color of light.

As shown in FIG. 2, the light laterally emitted through a side surface of the LED 30 is reflected by a reflecting member 2 having a curved surface and thereby refracted upward. This results in a greater beam angle of light emitted from the LED 30 and allows the backlight unit to be manufactured with a fewer number of LED packages 1.

However, in the backlight unit with the above configuration, the LED package 1 refracts light laterally using the difference in the refractive indices of the lens 20 and thus cannot completely block the light beams emitted upward through a central portion. Therefore, bright spots are exhibited in the portions corresponding to the positions of the LED packages 1. To eliminate such bright spots, a separate sheet is required, increasing the manufacturing costs.

Moreover, the complex shape of the lens 20 requires a difficult manufacturing process and entails limitations in the lens material. Further, in the case of using the above described lens 20, a large-sized LED 30 of at least 1 mm$^2$ is suitable, which however results in low light efficiency.

SUMMARY OF THE INVENTION

The present invention has been made to solve the foregoing problems of the prior art and therefore an object of certain embodiments of the present invention is to provide a an LED package which can uniformly emit light without any bright spots formed in an output screen, have an increased beam angle with a simpler shape of lens, and minimize a mixing region where different colors of light beams are mixed, thereby achieving miniaturization, and a backlight unit using the same.

According to an aspect of the invention for realizing the object, there is provided a light emitting diode package including: a housing with a seating recess formed therein; at least one light emitting diode seated in the seating recess; and a lens with a convex surface forming a predetermined sag, covering an upper part of the light emitting diode, the lens having a beam angle with a Full Width at Half Maximum (FWHM) in the range of at least 120 degrees.

The seating recess has a circular horizontal section.

The sag of the lens is formed on an upper side of the lens to form a beam angle with a Full Width at Half Maxmimum (FWHM) in the range of at least 120 degrees, and ranges 10 to 30% of a diameter of the convexed upper surface of the upper side.

The seating recess has a polygonal horizontal section.

The sag of the lens is formed on an upper side of the lens, and ranges 10 to 30% of a diagonal line of the convexed upper surface of the upper side.

The lens is adapted to cover the seating recess.

The lens comprises an encapsulant injected to fill inside the seating recess.

The lens is made of one selected from a group consisting of glass, silicone and resin.

The light emitting diode package includes at least two of the light emitting diode for emitting different colors of light, mounted in the seating recess.

A backlight unit according to the present invention includes the light emitting diode package described above.

The backlight unit includes at least two of the light emitting diode for emitting different colors of light, disposed adjacent to each other as a group.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

The following description will present an LED package and a backlight unit using the same according to the present invention with reference to the accompanying drawings.

Figure 1:
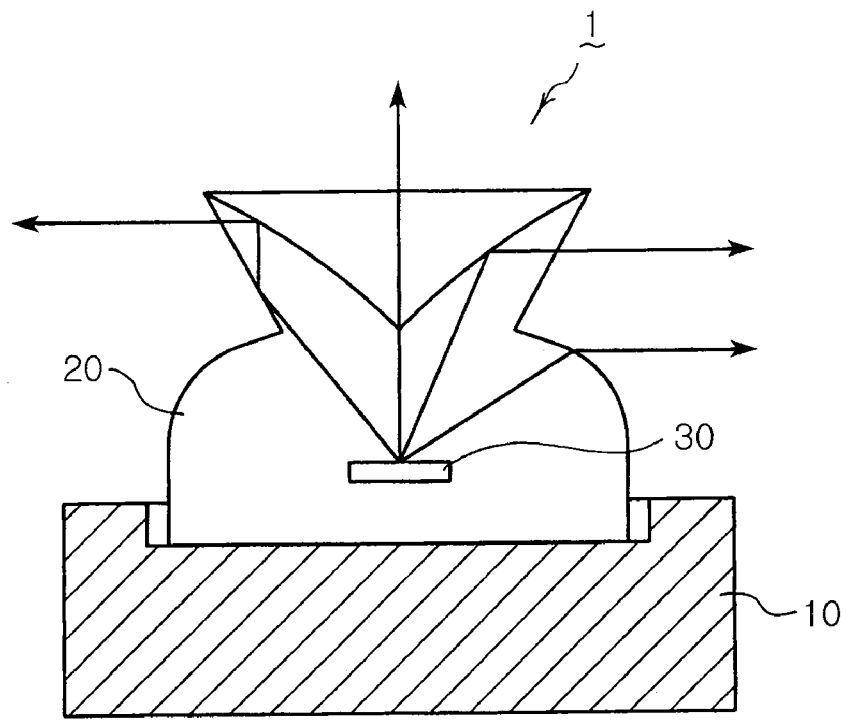
FIG. 1 is a sectional view illustrating a conventional LED package.
Figure 2:
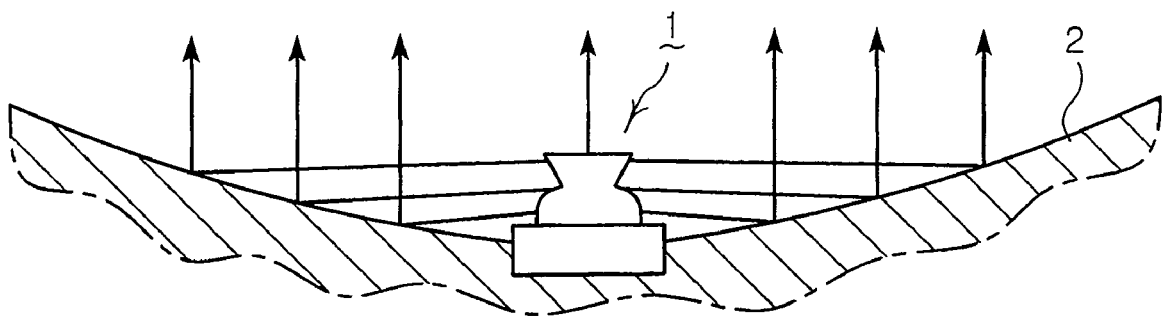
FIG. 2 is a sectional view illustrating a backlight unit using the conventional LED package.
Figure 3:
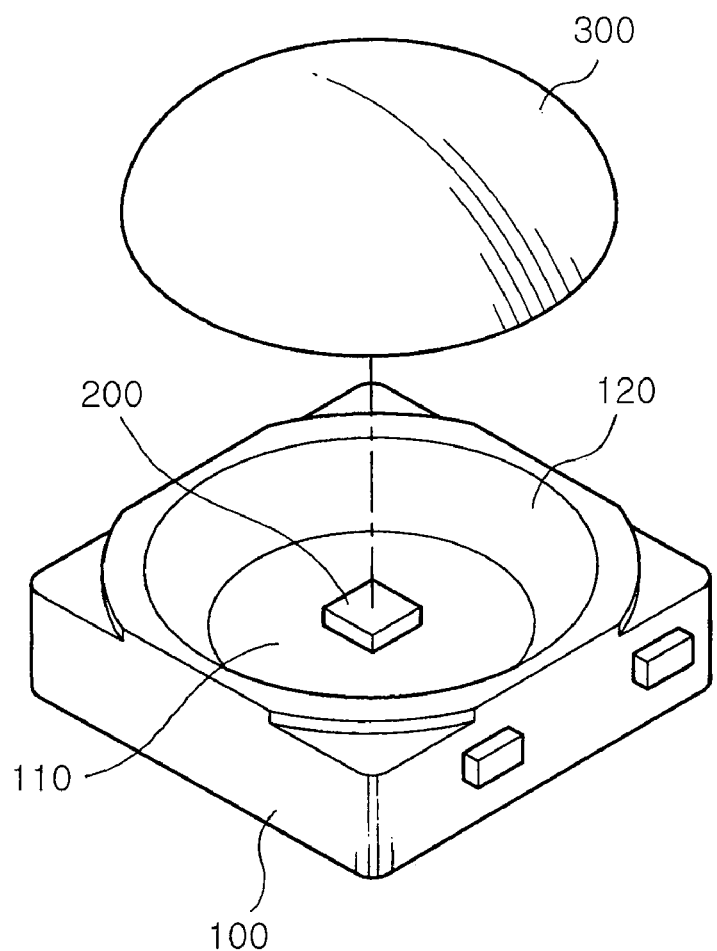
FIG. 3 is an exploded perspective view illustrating an LED package according to the present invention.
Figure 4:
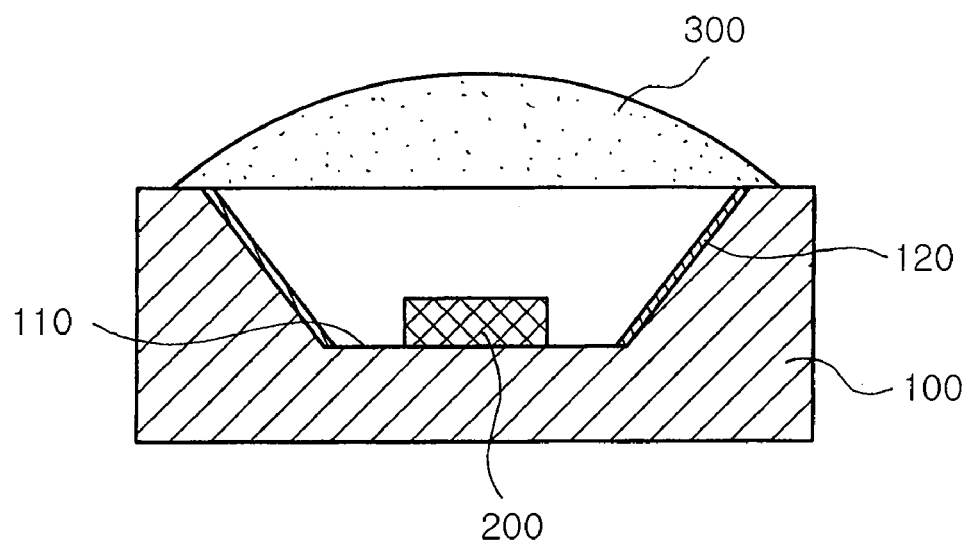
FIG. 4 is a sectional view illustrating the LED package according to the present invention.

FIG. 3 is an exploded perspective view illustrating the LED package according to the present invention, and FIG. 4 is a sectional view illustrating the LED package according to the present invention.

As shown in FIGS. 3 and 4, the LED package according to the present invention includes a housing 100 with a seating recess 110 formed in an upper portion thereof, an LED 200 seated on a floor surface of the seating recess 110 and a lens 300 having a convex surface on an upper side thereof, covering an upper part of the LED 200. The seating recess 110 has an inner wall sloped to have a narrower bottom, and the inner wall has a reflecting surface 120.

The light beams emitted upward from the LED 200 pass through the lens 300, and at this time, as the lens has a convex surface on an upper side thereof, the light beams emitted from the LED 200 are refracted in a large beam angle, i.e., refracted to spread laterally. In addition, the light beams directed from the LED 200 to the sidewall of the seating recess 110 are reflected by the reflecting surface 120 to propagate toward the lens 300.

The lens 300 can be made of glass or silicone, similar to the lens used in the conventional LED package, or can be manufactured through a process of a resin dotting process (i.e., a process of dispensing resin in the form of droplets or dots). The materials for fabricating a complex shape of lens applied to the conventional LED package are limited to a few among various materials that can be manufactured into the lens. However, the lens 300 applied to the present invention has a simple shape and thus can be advantageously made of various materials. For example, the lens applied to the conventional LED package is generally made of synthetic resin, which is extremely vulnerable to high temperature, and thus cannot be bonded to the housing 100 via a reflow. However, the lens 300 applied to the present invention can be made of material highly resistant to heat and thus can be fabricated via the reflow.

As the lens 300 applied to the present invention has much a simpler shape than the lens applied to the conventional LED package, it can easily be machined with low manufacturing costs. Further, the conventional LED package has the LED provided inside the lens, thus entailing a complicated manufacturing process. However, the LED package according to the present invention includes the LED 200 and the lens 300 separate from each other, thereby allowing a simple manufacturing process.

The configurations and operations of the housing 100 having the seating recess 110 and the reflecting surface 120 and the LED 200 are identical to those of the housing and the LED applied to the conventional LED package, and thus not described in detail.

Figure 5:
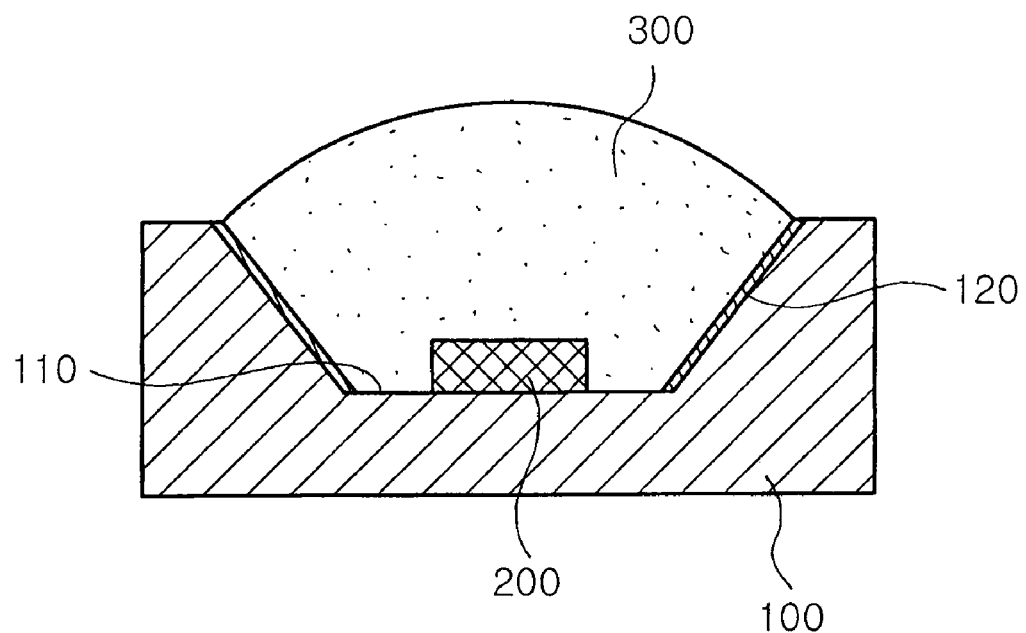
FIG. 5 is a sectional view illustrating an LED package according to a second embodiment of the present invention.

FIG. 5 is a sectional view illustrating an LED package according to a second embodiment of the present invention.

As shown in FIGS. 3 and 4, the lens 300 applied to the LED package according to the present invention can be separately manufactured from the housing 100 and then seated on an upper surface of the housing 100 afterwards, or as shown in FIG. 5, can be injected to fill inside the seating recess 110.

As shown in FIG. 5, in the case of filling inside the seating recess 110, the lens 300 may be made of a filler having a predetermined refractive index. In this case, the filler naturally forms a convex surface due to surface tension, thereby completing a shape of the lens 300 without further machining, which allows an easy fabrication process of the lens 300 irrespective of the size and shape of the seating recess 110.

In the embodiment shown in FIG. 5, the seating recess 110 is filled with a single material to fabricate the lens 300, but if it is necessary to adjust the refraction direction and angle of light from the LED 200, the lens 300 may be made of at least two kinds of fillers having different refractive indices, deposited on one another.

Figure 6:
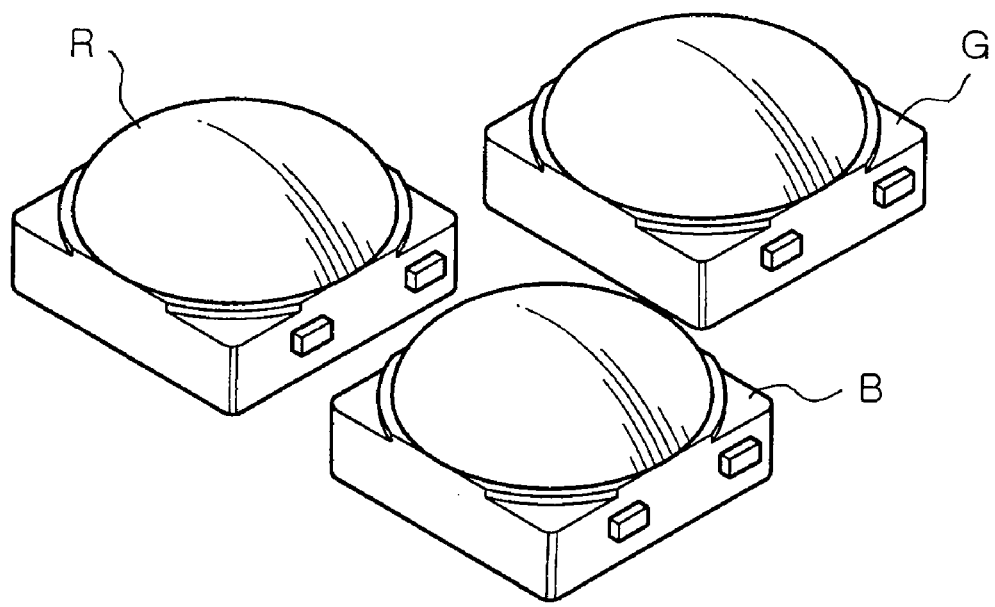
FIG. 6 is a perspective view illustrating an arrangement of the LED packages according to the present invention.
Figure 7:
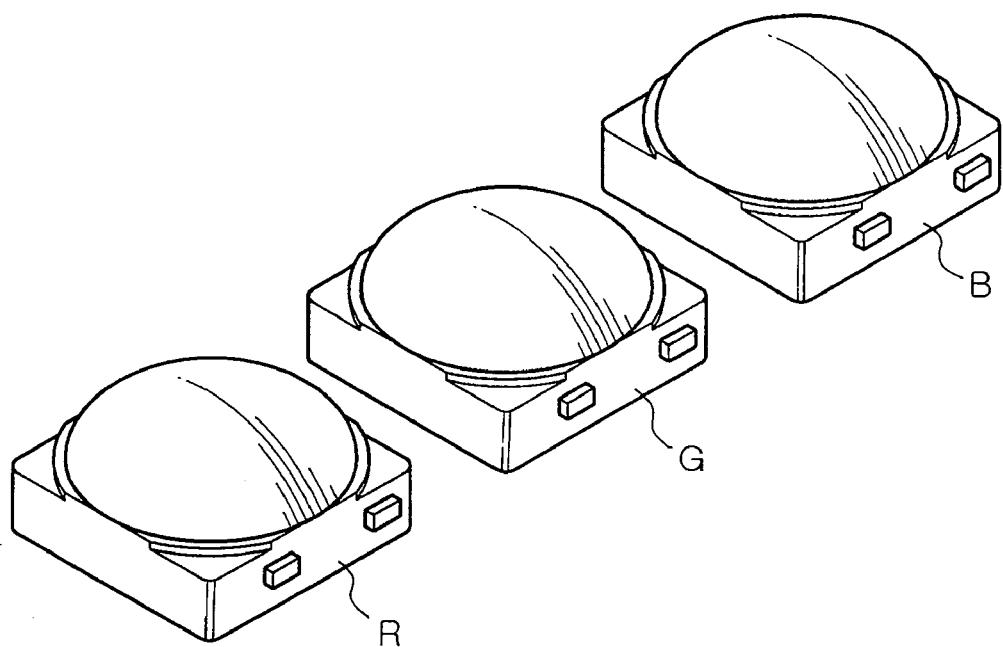
FIG. 7 is a perspective view illustrating another type of arrangement of the LED packages according to the present invention.

FIG. 6 is a perspective view illustrating an arrangement of the LED packages according to the present invention, and FIG. 7 is a perspective view illustrating another type of arrangement of the LED packages according to the present invention.

The LED package of the present invention described above is incorporated to complete the backlight unit according to the present invention.

In general, in order for the backlight unit to output various colors of light, it should be configured to output light mixed with red, green and blue light beams. Thus, the backlight unit of the present invention is manufactured with a red LED package R, a green LED package G and a blue LED package B emitting red, green and blue light beams, respectively.

As shown in FIG. 6, the LED packages R, G and B may be disposed adjacent to each other in a same interval as a group, or as shown in FIG. 7, may be disposed in a line. Here, each of the LED packages according to the present invention has a large direction of light emission, i.e., beam angle, thus resulting in a shorter color mixing region for mixing the colors. With the shorter mixing region, the backlight unit of the present invention is advantageously miniaturized as much.

In addition, this embodiment is exemplified by three LED packages R, G and B emitting red, green and blue light beams, respectively, but the number or the arrangement of the LED packages may be modified variously. For example, two LED packages emitting different colors of light may be arranged in a group, or at least four LED packages maybe arranged in a group.

Figure 8:
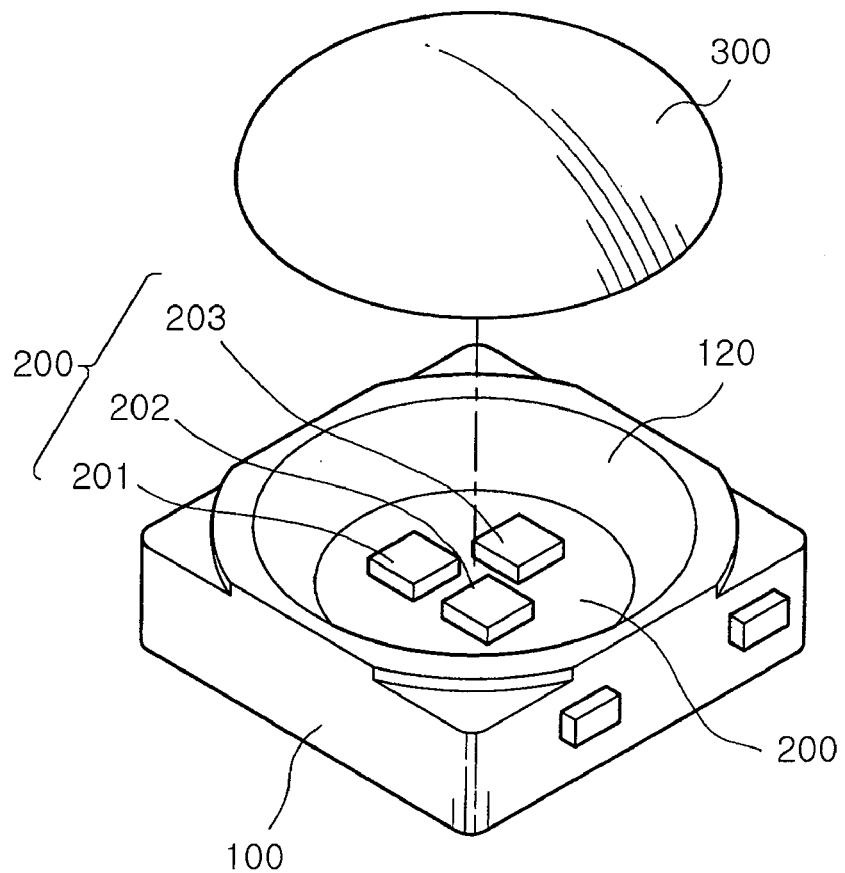
FIG. 8 is a perspective view illustrating an LED package according to a third embodiment of the present invention.

FIG. 8 is a perspective view illustrating an LED package according to a third embodiment of the present invention.

The LED package according to the present invention may be configured to include a plurality of LEDs 200, i.e., a red LED 201, a green LED 202 and a blue LED 204 mounted inside the seating recess 110.

With the plurality of LEDs 201, 202 and 203 mounted inside the single seating recess 110 to mix different colors in the housing 100, the color mixing region is advantageously shortened, which in turn allows realizing white light with a single LED package.

Here, the arrangement of the LEDs may be freely selected by the user. That is, the LEDs may be arranged in a group, disposed in a same interval from one another as shown in FIG. 8 or may be arranged in a line.

Figure 9:
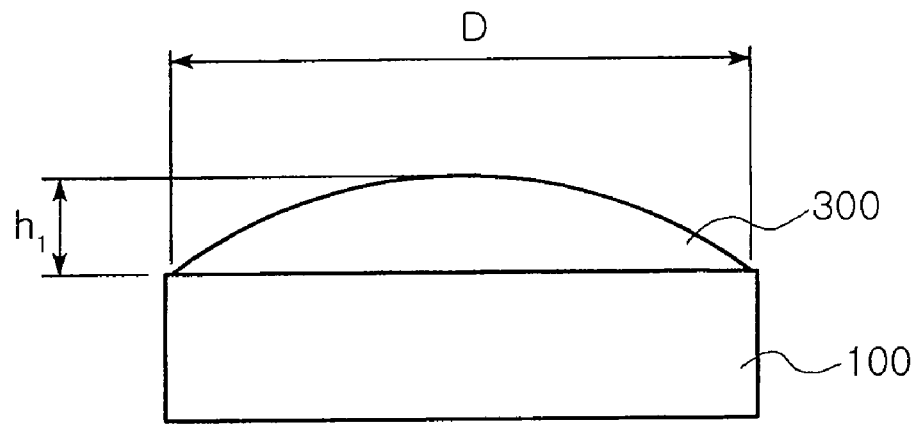
FIG. 9 is a side view illustrating the LED package according to the present invention.
Figure 10:
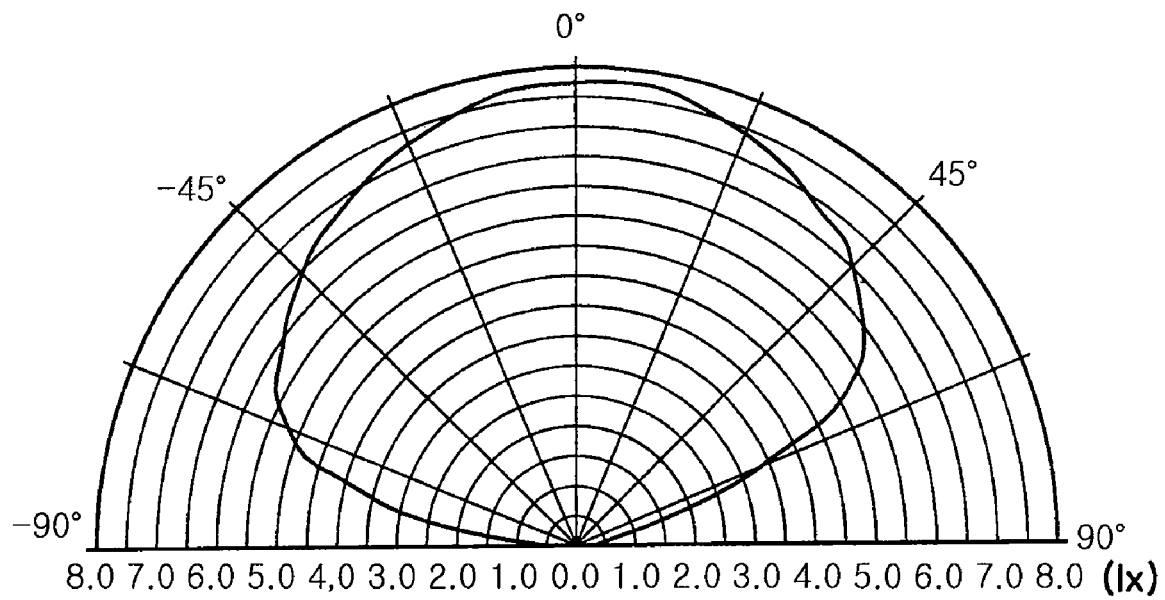
FIG. 10 is a graph showing a beam angle of the LED package shown in FIG. 9.
Figure 11:
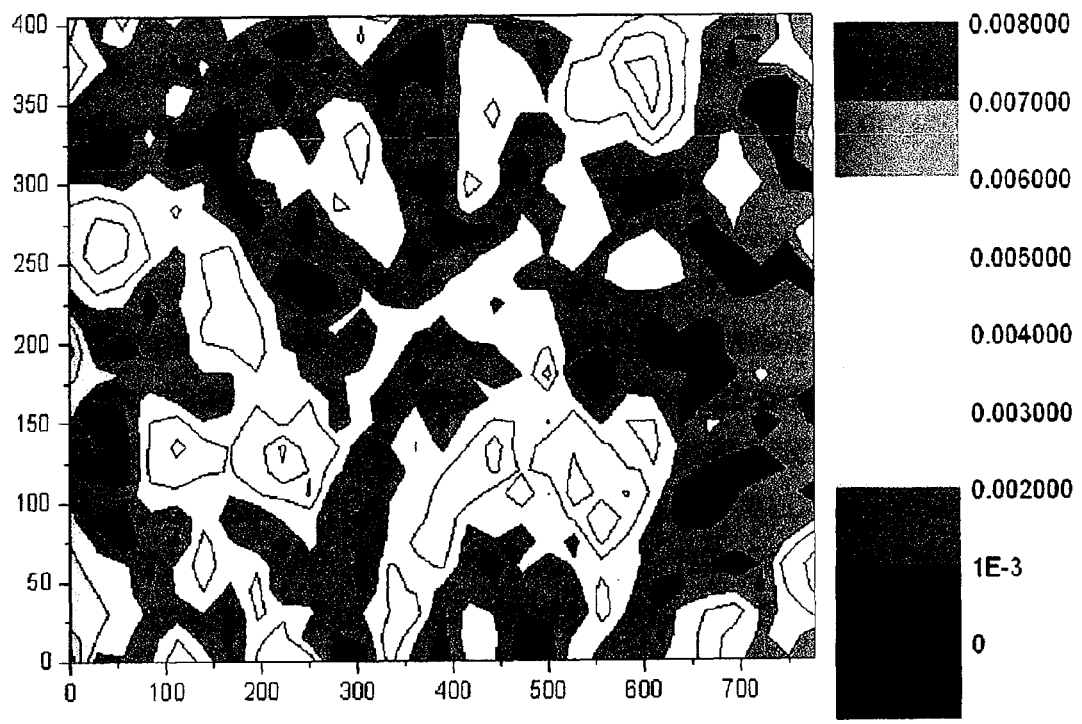
FIG. 11 illustrates a simulation result of color uniformity of the LED package shown in FIG. 9.

FIG. 9 is a side view illustrating the LED package according to the present invention, FIG. 10 is a graph showing a beam angle of the LED package shown in FIG. 9, and FIG. 11 illustrates a simulation result of color uniformity of the LED package shown in FIG. 9.

The LED package with the lens 300 having a convex surface on an upper side thereof mounted therein, has a larger beam angle than an LED package without such a lens 300. That is, the beam angle increases with a gradual increase of the sag from a plane surface of the lens 300.

In the embodiment shown in FIG. 9, the sag or the height $h_1$ protruding upward from an upper periphery of the lens 300 is 0.5 mm, and the diameter D of the lens 300, corresponding to an uppermost periphery of the seating recess 110 is 3 mm. As compared to the LED package having a beam angle of about 120 degrees without the lens 300, the LED package including the lens 300 described above, has a greater beam angle of about 140 degrees, as shown in FIG. 10.

In addition, with the greater beam angle of the LED package as described above, the light outputted onto the output screen forms a relatively uniform distribution as shown in FIG. 11. This allows the light beams to be sufficiently mixed even with a color mixing region formed rather low, thereby achieving miniaturization of the product. In the color chart shown in FIG. 11, the color closer to blue indicates high uniformity of light and the color closer to red indicates low uniformity of light.

Figure 14:
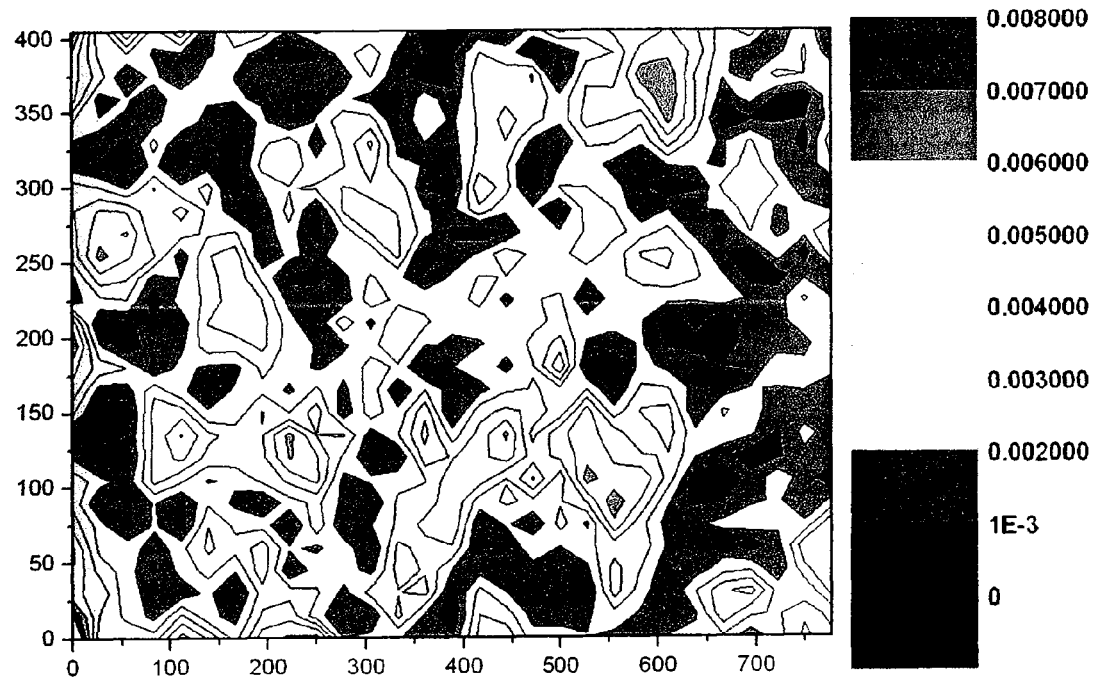
FIG. 14 illustrates a simulation result of color uniformity of the LED package shown in FIG. 12.
Figure 12:
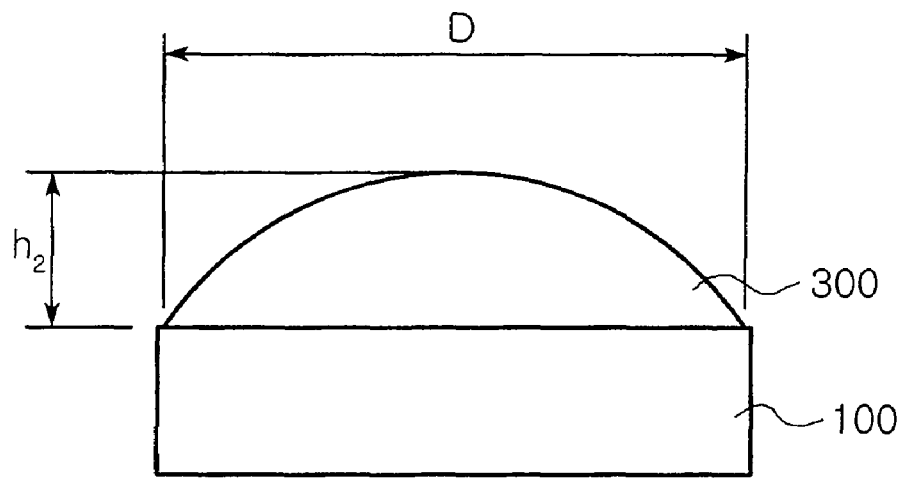
FIG. 12 is a sectional view illustrating an LED package according to further another embodiment of the present invention.
Figure 13:
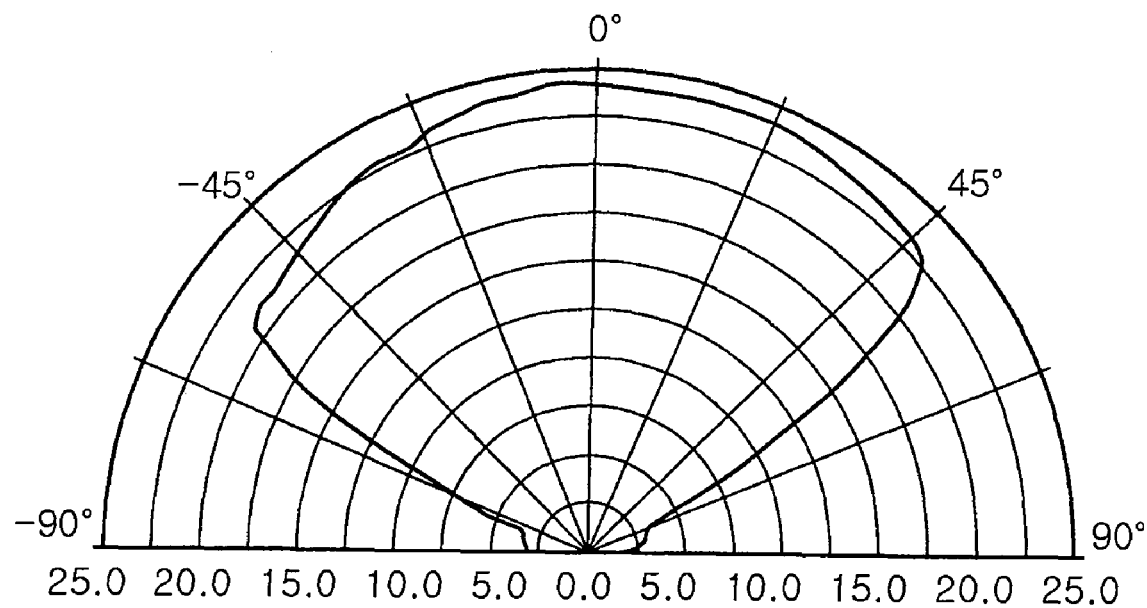
FIG. 13 is a graph showing a beam angle of the LED package shown in FIG. 12.

FIG. 12 is a side view illustrating an LED package according to another embodiment, FIG. 13 is a graph showing a beam angle of the LED package shown in FIG. 12, and FIG. 14 shows a simulation result indicating the color uniformity of the LED package shown in FIG. 12.

When the sag $h_1$ formed in the upper surface of the lens 300 is increased gradually to exceed 0.5 mm, the beam angle decreases on the contrary. If the sag $h_2$ of the lens 300 gradually increases to reach 0.8 mm as shown in FIG. 12, the beam angle of the LED package ranges about 125 degrees as shown in FIG. 13, with somewhat degraded color uniformity as shown in FIG. 14.

However, if the sag of the lens 300 exceeds 0.5 mm, the beam angle gradually decreases as shown in FIG. 13 while the emission efficiency is steadily improved. With improved emission efficiency of the LED package, the backlight unit has lower power consumption.

Figure 15:
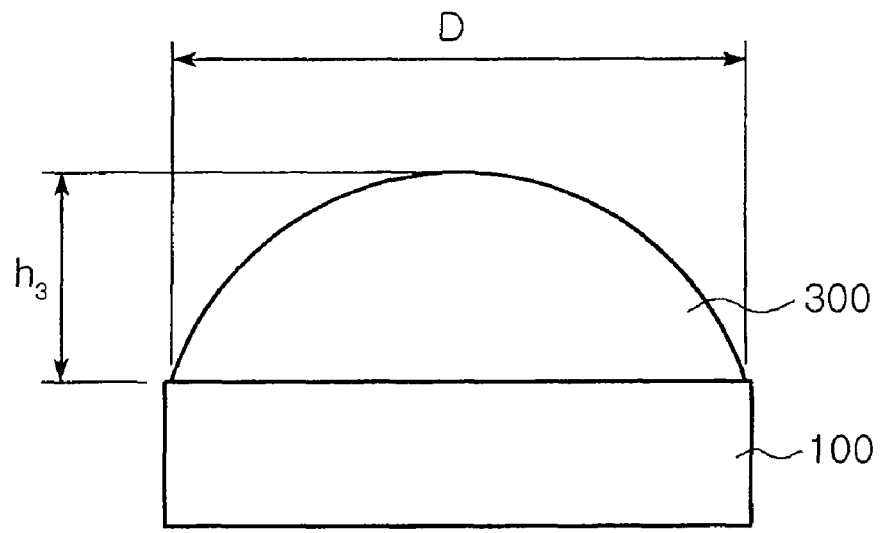
FIG. 15 is a sectional view illustrating an LED package according to yet another embodiment of the present invention.
Figure 16:
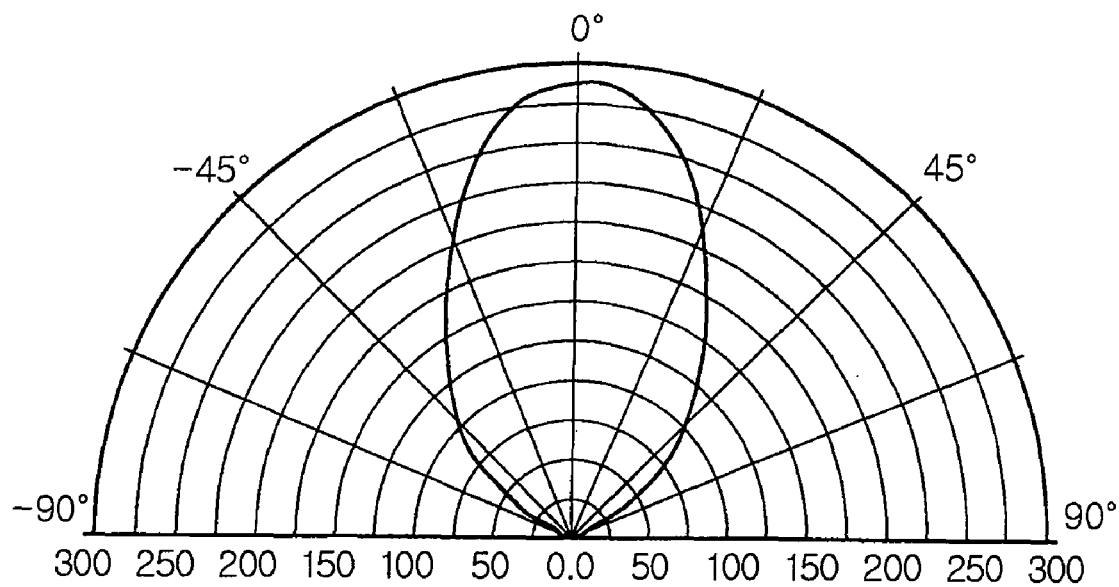
FIG. 16 is a graph showing a beam angle of the LED package shown in FIG. 15.

FIG. 15 is a side view illustrating an LED package according to another embodiment of the present invention, and FIG. 16 is a graph showing a beam angle of the LED package shown in FIG. 15.

When the sag of the lens 300 exceeds 0.8 mm, the beam angle as well as the emission efficiency decrease, and eventually when the sag $h_3$ reaches 1.1 mm as shown in FIG. 15, the beam angle and the emission efficiency is significantly decreased as shown in FIG. 16.

After measuring the beam angle and emission efficiency while adjusting the sag of the lens 300 as described above, the results indicate that the beam angle is greatest when the sag of the lens 300 is 0.5 mm, and the emission efficiency is greatest when the sag of the lens 300 is 0.8 mm. Since an object of the present invention is to form a large beam angle, it is preferable that the lens 300 has a sag of 0.3 to 0.5 mm. Here, as the size of the lens 200 may vary according to the size of the LED package, the shape of the lens 200 should be determined according to the ratios of different parts. That is, it is preferable that the sag of the lens 300 is formed on an upper side of the lens, and ranges 10 to 30% of a diameter of a convexed portion of the upper side.

In this embodiment, the seating recess 110 is formed circular, but the present invention is not limited to such. Alternatively, the seating recess 110 may be formed in a shape of polygonal pillar with a polygonal horizontal section. With the seating recess 110 formed as a polygonal pillar, it is preferable that the sag of the lens 300 is 10 to 30% of a diagonal line of the convexed portion of the upper side of the lens 300.

The LED package and the backlight unit using the same according to the present invention are capable of uniformly emitting light without bright spots formed in an output screen, can increase a beam angle using a simpler shaped lens, and can minimize a color mixing region where the different colors of light is mixed to realize miniaturization of the product.

While the present invention has been shown and described in connection with the preferred embodiments, it will be apparent to those skilled in the art that modifications and variations can be made without departing from the spirit and scope of the invention as defined by the appended claims.

What is claimed is:

1. A light emitting diode package comprising:
a housing with a seating recess formed therein;
at least one light emitting diode seated in the seating recess; and
a lens having a convexed upper surface above a generally horizontal section, the lens covering at least a portion of an upper part of the at least one light emitting diode, the lens having a beam angle with a Full Width at Half Maximum (FWHM) in the range of at least 120 degrees, wherein the lens has a height, which is a perpendicular distance from the horizontal section to an apex of the convexed upper surface, that ranges 1/10 to 4/15 of a diameter of the horizontal section.

2. The light emitting diode package according to claim 1, wherein the lens is adapted to cover the seating recess.

3. The light emitting diode package according to claim 1, wherein the lens comprises an encapsulant injected to fill inside the seating recess.

4. The light emitting diode package according to claim 1, wherein the lens is made of one selected from a group consisting of glass, silicone and resin.

5. The light emitting diode package according to claim 1, comprising at least two of the light emitting diode for emitting different colors of light, mounted in the seating recess.

6. The light emitting diode package of claim 1, wherein the horizontal section is in a horizontal cross-sectional plane of the lens.

7. The light emitting diode package of claim 1, wherein the horizontal section is in a horizontal plane bounded by a periphery of the upper convexed surface.

8. The light emitting diode package of claim 1, wherein a plain view of the seating recess has a circular shape.

9. The light emitting diode package of claim 1, wherein a plain view of the seating recess has a polygonal shape.

10. The light emitting diode package of claim 1, wherein the seating recess has a cup shape having a bottom surface and a sidewall which extends from the bottom surface to a periphery of an opening of the housing in a cross axial direction.

11. The light emitting diode package of claim 10, further comprising
a reflector disposed on the sidewall.

12. A backlight unit including:
a plurality of light emitting diode packages arranged with one another at a predetermined interval,
each of the plurality of light emitting diode packages comprises:
a housing with a seating recess formed therein;
at least one light emitting diode seated in the seating recess; and
a lens having a convexed upper surface above a generally horizontal section, the lens covering at least a portion of an upper part of the at least one light emitting diode, the lens having a beam angle with a Full Width at Half Maximum (FWHM) in the range of at least 120 degrees, wherein the lens has a height of the lens, which is a perpendicular distance from the horizontal section to an apex of the convexed upper surface, that ranges $1/10$ to $4/15$ of a diameter of the horizontal section.

13. The backlight unit of claim 12,
wherein the plurality of light emitting diode packages are arranged with one another at the same distance.

14. The back light unit of claim 12, wherein the seating recess has a cup shape having a bottom surface and a sidewall which extends from the bottom surface to periphery of an opening of the housing in a cross axial direction.

15. The back light unit of claim 12, further comprising
a reflector disposed on the sidewall.

16. The back light unit of claim 12, wherein a plain view of the seating recess has a circular shape.

17. The back light unit of claim 12, wherein a plain view of the seating recess has a polygonal shape.

18. The back light unit of claim 12, wherein the horizontal section is in a horizontal cross-sectional plane of the lens.

19. The back light unit of claim 12, wherein the horizontal section is in a horizontal plane bounded by a periphery of the upper convexed surface.

\* \* \* \* \*